(12) United States Patent
Li et al.

(10) Patent No.: US 11,108,343 B2
(45) Date of Patent: Aug. 31, 2021

(54) FLEXIBLE AND SOFT SMART DRIVING DEVICE

(71) Applicant: Zhejiang University, Hangzhou (CN)

(72) Inventors: Tiefeng Li, Hangzhou (CN); Zhanan Zou, Hangzhou (CN); Chi Li, Hangzhou (CN); Guoyong Mao, Hangzhou (CN); Xuxu Yang, Hangzhou (CN); Zhipeng Zhai, Hangzhou (CN); Shaoxing Qu, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 552 days.

(21) Appl. No.: 16/152,245

(22) Filed: Oct. 4, 2018

(65) Prior Publication Data

US 2019/0036464 A1    Jan. 31, 2019

Related U.S. Application Data

(63) Continuation of application No. 15/112,280, filed as application No. PCT/CN2014/077492 on May 14, 2014, now Pat. No. 10,122,302.

(30) Foreign Application Priority Data

Jan. 28, 2014   (CN) .......................... 201410042587.2
Apr. 29, 2014   (CN) .......................... 201410178842.6

(51) Int. Cl.
*H02N 11/00*   (2006.01)
*H01L 41/04*   (2006.01)
(Continued)

(52) U.S. Cl.
CPC ............... *H02N 11/00* (2013.01); *H01H 9/54* (2013.01); *H01L 41/042* (2013.01);
(Continued)

(58) Field of Classification Search
CPC .......... H02N 11/00; H02N 2/021; H01H 9/54; H01L 41/042; H01L 41/0926; H01L 41/193
See application file for complete search history.

(56) References Cited

U.S. PATENT DOCUMENTS 7,411,331 B2 * 8/2008 Dubowsky ............. G01R 33/28
                                                   310/309
7,626,319 B2 * 12/2009 Heim ..................... F04B 43/04
                                                   310/311
(Continued)

FOREIGN PATENT DOCUMENTS

CN    101884160 A    11/2010
CN    102275858 A    12/2011
(Continued)

*Primary Examiner* — Bryan P Gordon

(57) ABSTRACT

A flexible and soft smart driving device comprises a flexible frame, a driving mechanism and a creeping structure. The driving mechanism uses an intrinsic strain of an intelligent soft material to generate a driving force. A creeping structure is used to implement autonomous activities of the flexible and soft smart driving device. The driving mechanism and the creeping structure are attached to the flexible frame. The driving mechanism generates the driving force by contraction and relaxation of a driving membrane. The flexible and soft smart driving device is made from flexible materials and has advantages of good creeping speed, flexible control, small noise and high human body compatibility.

10 Claims, 9 Drawing Sheets

(51) Int. Cl.
*H01L 41/09* (2006.01)
*H01L 41/193* (2006.01)
*H02N 2/02* (2006.01)
*H01H 9/54* (2006.01)

(52) U.S. Cl.
CPC ........ *H01L 41/0926* (2013.01); *H01L 41/193* (2013.01); *H02N 2/021* (2013.01)

(56) References Cited

U.S. PATENT DOCUMENTS

| | | |
|---|---|---|
| 8,471,438 B2 | 6/2013 | Yamamoto et al. |
| 2007/0296308 A1* | 12/2007 | Yamamoto ............. H02N 2/025 310/328 |
| 2010/0013354 A1* | 1/2010 | Marth ................... H02N 2/062 310/317 |
| 2010/0244634 A1 | 9/2010 | Nagai et al. |
| 2013/0234562 A1* | 9/2013 | Moler .................. H01L 41/053 310/328 |

FOREIGN PATENT DOCUMENTS

| | | |
|---|---|---|
| CN | 103208942 A | 7/2013 |
| WO | 2012099854 A1 | 7/2012 |

\* cited by examiner

FLEXIBLE AND SOFT SMART DRIVING DEVICE

CROSS REFERENCE TO RELATED APPLICATION

This application is a continuation of a U.S. patent application Ser. No. 15/112,280, filed Jul. 18, 2016, titled "Flexible intelligent driving device," which is a national stage application of International application number PCT/CN2014/077492, filed May 14, 2014, titled "Flexible intelligent driving device," which claims the priority benefit of Chinese Patent Application Nos. 201410042587.2 and 201410178842.6, filed on Jan. 28, 2014 and Apr. 29, 2014, respectively, which is hereby incorporated by reference in its entirety.

TECHNICAL FIELD

The present disclosure involves a robotic field, specifically involves a kind of flexible and soft smart driving device driven by an intrinsic strain of an intelligent soft material.

BACKGROUND

Conventional robots mostly use rigid structures that comprise many rigid transmission parts such as gears, chains, etc. Since employing rigid materials, conventional robots can easily produce problems of malposition and damaging. At the same time, since lubrication amid rigid structure is limited, they easily generate relatively large noise when operating. Existing flexible robots mostly use shape memory alloy (SMA) spring to actuate, and they have slow creeping speed and are weak to resist external pressing and shocking in addition to shortcoming of inflexible steering. Existing robotic structures which uses dielectric elastomer (DE) membranes to actuate and uses the principle of combination of driving force generated by DE and transmission structures. Since existing robotic structures include rigid frames (for example, metal frame) and rigid interconnecting parts (for example, spring, gear, hinge, screw, bolt etc.), they have shortcomings of being weak to resist external pressing and shocking integrally and therefore are not able to produce compressive deformation.

SUMMARY

Aimed at the shortages of existing technology and the technical problem, the present disclosure provides a kind of a flexible and soft smart driving device. The flexible and soft smart driving device is driven by an intrinsic strain of intelligent soft material and can operate autonomously such as creeping autonomously. The autonomous creep indicates that it uses self-relaxation and self-contraction to implement worm-like creeping without utilizing transmission mechanisms (such as gear, turbine worm, chain, connecting rod etc.) or specialized creeping mechanisms (such as creeping claw (usually more than three hooks), bionic crawling foot etc.) to creep. The flexible and soft smart driving device is a soft structure. It is based on the principle of using the intrinsic strain of DE (acted as intelligent soft material) to drive flexible frame. The flexible and soft smart driving device doesn't include any rigid interconnecting parts (such as spring, gear, hinge, screw, bolt, etc.). Compared to the existing technology, it has the advantages of being strong to resist external pressing and shocking, light weight, and low noise.

Aimed at the disadvantages such as slow creeping speed, easily being damaged, large noise of existing robotic structure, the disclosure discloses a novel kind of a flexible and soft smart driving device, combined with an intrinsic strain of a flexible soft material.

The specific technical scheme of the disclosure is as follows:

A flexible and soft smart driving device comprising: a flexible frame, a driving mechanism and a movement structure, such as creeping structure, wherein the driving mechanism uses an intrinsic strain of intelligent soft material to generate the driving force. The intelligent soft material refers to specific material that can produce relatively remarkable free deformation under the external stimuli (exclude force field), such as an electric field, a magnetic field, a thermal field, an optical field, an electromagnetic field, a thermomagnetic field. As a kind of flexible materials, the intelligent soft material has a relatively soft mechanical property. Stiffness and modulus of the intelligent soft material are small, and its free deformation is able to restore. In some implementations, the intelligent soft material is chosen from dielectric elastomer (DE). The intrinsic strain refers to that the material can produce deformation under external stimuli, such as an electric field, a magnetic field, a thermal field, an optical field, an electromagnetic field, a thermomagnetic field. This kind of deformation doesn't depend on the external mechanical loading. Accordingly, this kind of deformation is produced by material itself, such as the phenomenon of heat-expansion and cold-contraction. The driving force produced by this kind of deformation can make the flexible frame of the flexible and soft smart driving device produce periodical deformation. The intrinsic strain involved in the present disclosure is produced by electric field effects, that is, by applying high voltage (usually 6 kV-9 kV) to the flexible and soft smart driving device to make it produce deformation.

The creeping structure is used to achieve a autonomous creep of the flexible and soft smart driving device. Since the flexible and soft smart driving device of this disclosure doesn't need the transmission mechanisms (such as gear, turbine worm, chain, connecting rod etc.) or specialized creeping mechanisms (such as creeping claw (usually more than three hooks), bionic crawling foot). The flexible and soft smart driving device utilizes the friction between the flexible frame's self-deformation and the contact surface (such as ground surface, wall surface, roof, etc.) to creep. Utilizing simple creeping mechanism (namely unidirectional frictional mechanism) can increase the friction between the flexible frame and the contact surface, which can improve the creeping efficiency of the flexible and soft smart driving device significantly.

The driving structure and the movement structure (such as creeping structure) are attached to the flexible frame (for example, attached to both the principal surfaces of the flexible frame respectively). The flexible frame refers to the frame made by elastic material, and its bending stiffness is small. This is beneficial to the autonomous creep of the flexible and soft smart driving device.

The flexible and soft smart driving device's autonomous activity such as autonomous creep depends on the driving structure utilizing intelligent soft material's intrinsic strain to drive the flexible frame. The autonomous activity is achieved by the flexible frame's worm-like contraction and relaxation deformation.

In some implementations, the flexible and soft smart driving device can employ elastic material such as silicone, polydimethylsiloxane (PDMS) and so on. In some implementations, silicone materials may be used; further preferentially, adding silicon dioxide powders during the silicone curing process to enhance the toughness of the silicone flexible frame.

In some implementations, the creeping structure of the present disclosure the flexible and soft smart driving device can depend on intelligent membrane to drive the flexible frame by the flexible frame's worm-like contraction and relaxation deformation, as shown in FIG. 2.

In some implementations, the driving structure can comprise the driving membrane and the external compliant electrodes, the external compliant electrodes are coated on both sides of the driving membranes, the flexible and soft smart driving device's driving force is generated by the contraction and relaxation of driving membrane (21). The driving membrane can be one piece or two pieces.

In some implementations, the driving structure can comprise driving membrane array, interior compliant electrodes, interior wires, external compliant electrode. Wherein, the driving membrane array is formed by two pieces of driving membrane bonding together, the interior compliant electrodes are divided into two parts. The interior compliant electrodes are packaged in the inner part of the two pieces of driving membrane. The interior wires have two wires. The one end of the interior wires is contacted with interior compliant electrodes respectively. Further, the other end of the interior wires is led out to connect to one pole of external power source. The external compliant electrode is coated on the outer surface of the driving membrane array and is connected to another pole of external power source. The flexible and soft smart driving device's driving force is generated by the contraction and relaxation of driving membrane or driving membrane array.

In some implementations, the driving membrane of the present disclosure is the pre-stretched flexible insulated membrane. The driving membrane was pre-stretched before it is attached to the flexible frame. As for the intelligent soft material, the pre-stretch refers to stretching this kind of material to certain state first, and then fixing it to flexible frame to make flexible frame in buckling state (as shown in FIG. 2). After pre-stretch, the driving structure can actuate very easily. Because when the driving structure is under external stimuli, the pre-stretch of this part can be relaxed, thus making the flexible frame switch from buckling state to straight state.

In some implementations, the driving membrane of the present disclosure has to be pre-stretched in both creeping direction and transverse direction. And the pre-stretch in creeping direction is slightly larger than that of transverse direction.

In some implementations, the driving membrane of the present disclosure is dielectric elastomer. It can be chosen as one or more kinds among silicone, acrylate elastomer, polyurethane elastomer, Buna-N rubber. In some implementations, the driving membrane is VHB4910 (3M).

In some implementations, the compliant electrodes of the present disclosure are divided into two parts. One part is the interior compliant electrodes. They are sandwiched between two pieces of driving membrane and packaged in the inner part of the flexible and soft smart structure. The other part is the external compliant electrodes. They are coated directly on the top and bottom surface of the driving membrane. One end of the interior wires is contacted with the interior compliant electrodes; the other end is led out from two pieces of driving membrane to connect to the live wire of the external high-voltage source. Further, the external compliant electrodes are directly connected to the ground wire of the external high-voltage source.

In some implementations, the interior compliant electrodes can be divided into separate regions, namely dividing the interior compliant electrodes into different separate regions to implement multi-piece actuating. By applying voltage of 6 kV-9 kV to different regions, the flexible and soft smart driving device is able to change direction. For example, the interior compliant electrodes can be divided into region 1 and region 2, as shown in FIG. 3. When applying voltage of 6 kV-9 kV to region 1, only region 1 can produce driving force. At this time, region 2 is in the static state. Therefore, when the flexible and soft smart driving device is creeping forward, region 1 is in the active motion state, while region 2 is in the passive motion state even the static state. Therefore, the flexible and soft smart driving device will bend toward region 2. Similarly, when applying voltage of 6 kV-9 kV to region 2, the flexible and soft smart driving device will bend toward region 1, consequently achieving the flexible and soft smart driving device's function of turning through this partition method. When requiring the flexible and soft smart driving device to turn free, reasonable control may be applied to these two regions.

In some implementations, the compliant electrodes of the present disclosure can employ material such as carbon greases, conductive gels etc. In some implementations, carbon greases may be used as the compliant electrodes. The interior compliant electrodes, the external compliant electrode can employ the same kind of material or different materials.

In some implementations, the creeping mechanism of the present disclosure is the unidirectional frictional mechanism. One end of the unidirectional frictional mechanism is inserted into the inner part of the flexible and soft smart driving device's flexible frame. The other end functions as the flexible and soft smart driving device's movement foot or creeping foot to contact with contact surface (such as ground surface, wall surface, roof, etc.). Utilizing unidirectional frictional mechanism can increase the flexible and soft smart driving device's grip efficiently to increase the creeping efficiency. At the same time, because as for the unidirectional frictional mechanism, the friction in backward direction is far larger than in forward direction. Thus it can be granted that the flexible and soft smart driving device is creeping forward instead of wriggling in the place.

In some implementations, the unidirectional frictional mechanism is direction-changeable structure. When the flexible intelligent driving structure needs to creep backward, the unidirectional frictional mechanism may be rotated by the angle of 180. At this time, the friction produced by the unidirectional frictional mechanism's forward movement is far larger than that of backward movement, thus changing the flexible intelligent driving structure's creeping direction and making it creep backward.

In some implementations, the numbers and the arranging methods of the unidirectional frictional mechanism depend on the size of the flexible and soft smart driving device and the shape of the flexible frame. In some implementations, small-sized triangle flexible frame utilizes three-unidirectional frictional mechanisms and arranges one in the front-end and the other two in the rear-end. The material of the unidirectional frictional mechanism can be stainless steel or other rigid materials.

In some implementations, the flexible and soft smart driving device further comprise protecting structure. The protecting structure is used to protect the driving mechanism. The protecting structure is attached to the flexible frame.

In some implementations, the protecting structure is two pieces of pre-stretched protecting membrane. The protecting membrane is flexible insulating membrane. The two pieces of protecting membranes are attached to both sides of the driving membranes or driving membrane array.

In some implementations, the two pieces of driving membrane and two pieces of protecting membrane are bound together and are attached to the flexible frame to make the flexible frame bend, such as toward one direction or one principal plane's direction.

In some implementations, to reduce the influence to driving membrane, the two pieces of protecting membrane may carry the same pre-stretch as the driving membrane. After pre-stretch, the two pieces of protecting membrane are directly attached to both sides of the driving membranes. Since the flexible electrodes sandwiched between the two driving membranes are directly connected to the live wire of the external high-voltage source and easily produce electric leakage, the main function of the protecting membranes is to prevent electric leakage.

In some implementations, the material of the protecting membranes is dielectric elastomer, employing VHB 9473 (3M) as the material of the driving membrane. The material of driving membrane can be same as or different with that of the protecting membrane.

In some implementations, the size of the flexible and soft smart driving device can be 1 mm~500 mm, preferentially 10 mm~450 mm, further preferentially, 20 mm~400 mm.

In some implementations, the flexible frame's thickness of the flexible and soft smart driving device is able to adjust. And the flexible frame's thickness should be appropriately adjusted according to the different material of the flexible frame so as to achieve a reasonable extent of bending after bonded with the driving mechanism, so as to achieve creeping. The material of the flexible frame can be soft material possessing elasticity such as silicone, polydimethylsiloxane (PDMS), rubber and so on.

In some implementations, the flexible frame of the flexible and soft smart driving device is elastic structure, preferentially, employing triangular flexible frame.

The present disclosure the flexible intelligent driving structure can creep alone. Multiple robots can also form the flexible intelligent driving structure array by bonding through the flexible frame, achieving in series or in parallel assembly of the machines to achieve combined creeping or combined actuating.

The present disclosure utilizes intelligent soft material (for example, the dielectric elastomer) to convert electric energy to mechanical energy. The converting efficiency is high, and the actuating effect is good; so the creeping speed is very fast. Since the whole flexible and soft smart driving device utilizes the flexible material with no transmission parts or rigid structures, it has a strong ability to resist external pressing, shocking and falling, and to function under water or in the vacuum environment. At the same time, since the flexible and soft smart driving device of the present disclosure has a simple structure and the employed flexible materials are light material; thus it has features of small volume, light weight. This reduces the noise of the flexible and soft smart driving device during creeping to a large extent.

The present disclosure also provides a kind of the flexible and soft smart driving device array. The array may include multiple above-mentioned flexible and soft smart driving devices. The connecting manner of the flexible and soft smart driving devices is in series or in parallel. The multiple flexible and soft smart driving devices are bonded through flexible frames.

In some implementations, the flexible and soft smart driving device or the flexible and soft smart driving device array further includes a power source module which works on the previous driving mechanism.

In some implementations, the power source module is small-sized high-voltage source module which is rapidly dischargeable and continuously tunable. The power source module includes an input port, a power switch module, a pulse transformer, a voltage-multiplying rectifying circuit, a voltage output port, a feedback bleeder circuit, a control circuit, an isolated drive module, and a mechanical switch module.

The input port, which is connected to power switch module, is used to supply input voltage to the power switch module.

The power switch module, which is connected to the isolated drive module and the pulse transformer respectively, is controlled by switch driving signals from the isolated drive module.

The power switch module converts input voltage from input port to high frequency switch signal which outputs to the pulse transformer.

The pulse transformer, which is connected to the power switch module and the voltage-multiplying rectifying circuit respectively, is used to independently amplify high frequency switch signals from the power switch module and output to a voltage-multiplying rectifying circuit.

The voltage-multiplying rectifying circuit, which is connected to the pulse transformer and the voltage output port respectively, is used to voltage-multiply the signal from the pulse transformer, and step up to the voltage needed and then rectify the signal to output to the voltage output port.

The voltage output port, which is connected to the voltage-multiplying rectifying circuit, the mechanical switch module and the feedback bleeder circuit respectively, is used to output ultimate voltage signals.

The feedback bleeder circuit, which is connected to the voltage output port and the control circuit respectively, is used to feed back the voltage signal from the voltage output port to the control circuit, and then to achieve the constant voltage modulation of the high-voltage source module's output voltage.

The control circuit, which is connected to the isolated drive module, the feedback bleeder circuit and the mechanical switch module respectively, produces the switch control signal and the step-down control signal according to the signal from the feedback bleeder circuit, outputs the switch control signal to the isolated drive module and outputs the step-down control signal to the mechanical switch module.

The control circuit achieves the constant voltage modulation of the high-voltage source module's output voltage.

The isolated drive module, which is connected to the control circuit and the power switch module respectively, is used to amplify the power of the switch control signal from the control circuit and convert to switch driving signal and then output it to the power switch module.

The isolated drive module achieves the electric isolation between the control circuit and the power switch module.

The mechanical switch module, which is connected to the voltage output port and the control circuit respectively, accepts the step-down control signal from the control circuit, and discharges redundant charge in the voltage output port to achieve the step-down of the output voltage.

In some implementations, the mechanical switch module may include two wafers and one miniature steering engine. The two wafers comprise a moving wafer and a fixed wafer. The moving wafer is connected to the positive pole of voltage output port; the fixed wafer is connected to the negative pole of voltage output port. The moving wafer is connected to the miniature steering engine. The moving wafer can locate in the arm of the miniature steering engine. The miniature steering engine is connected to the moving wafer and the control circuit respectively. In the process of stepping up voltage, the rotation angle of the miniature steering engine doesn't change, which makes the two contact points being kept at the largest distance. In the process of stepping down voltage, the rotation angle of the miniature steering engine is tuned, and the moving wafer is controlled by the miniature steering engine to conduct near field electric arc short circuit with fixed wafer in the output port, and redundant charge in the capacitance is discharged. After near field electric arc short circuit, the steering engine rotates reversely and returns to original location at once within several hundred milliseconds. It is used to achieve fast voltage stepping down and safety protecting. This discharging mode is fast and simple.

Further, the isolated drive module may include a cache driver chip and an optical coupler. The cache driver chip is connected to the control circuit and the optical coupler respectively. The optical coupler is connected to the cache driver chip and the power switch module respectively. The isolated drive module is used to achieve the electric isolation between the control circuit and the power switch module. The cache driver chip and the optical coupler are used to amplify the power of switch control signal from control circuit.

Further, the range of the input port's voltage is direct current 5 V~32 V, preferentially 7 V~25V.

Further, the discharging time of the output fast stepping down voltage is below 700 ms, preferentially below 600 ms, further preferentially below 500 ms.

Further, the control circuit is single-chip control circuit.

Further, the output of the high-voltage source module is direct current 0 V~6000 V (preferentially 1~5900 V, more preferentially 5~5800 V, further more preferentially 8~5700 V) and is continuously tunable.

Further, the pulse transformer outputs high frequency switch signal with 0 V~600 V (preferentially 1~590 V, more preferentially 5~580 V, further more preferentially 8~570 V).

Further, the voltage-multiplying rectifying circuit is ten-time voltage rectifying circuit.

Further, the output voltage of the high-voltage source module is direct current 2000 V~15000 V (preferentially 2100~14500 V, more preferentially 2500~14000 V) and is continuously tunable.

The beneficial outcomes of the flexible and soft smart driving device of the present disclosure are provided as follow.

By changing amplitude and frequency of the externally applied voltage of the flexible and soft smart driving device, the flexible and soft smart driving device can change its creeping speed. At the same time, by conducting partition control of the compliant electrodes, the flexible and soft smart driving device is able to change direction. Because the voltage response speed of dielectric elastomer is fast, the flexible and soft smart driving device is able to creep speedily and change direction agilely.

Because apart from the creeping structure of the flexible and soft smart driving device, all the other structures (including flexible frame, driving structure, protecting structure) employ flexible materials. They have a strong ability to resist destruction. And the flexible and soft smart driving device cannot be damaged even under large external pressure, shock and falling down. Because the flexible materials possess elasticity, the flexible and soft smart driving device is able to restore to its original configuration and continue to work within a short period even under pretty large deformation caused by external pressure.

The present disclosure provides the flexible and soft smart driving device that doesn't have transmission mechanisms, nor specialized creeping structure. The flexible and soft smart driving device has simple structure, small size, light weight, and small noise during creeping.

The present disclosure the flexible and soft smart driving device needs high voltage to actuate. It can be achieved by external high-voltage source, or by packaging small-sized high-voltage source directly into the inner of the flexible and soft smart driving device. In this situation, the flexible and soft smart driving device's power source is separated entirely from external. That makes human's hand can touch the flexible and soft smart driving device directly. The flexible and soft smart driving device has high human body compatibility.

The beneficial effect of the small-sized high-voltage source which is used in the previous flexible and soft smart driving device is that through the control circuit, the input voltage produces high output voltage in the voltage output port when passing a input port, a power switch module, a pulse transformer, a voltage-multiplying rectifying circuit, a voltage output port, a feedback bleeder circuit, an isolated drive module and that the output voltage is continuously tunable. At the same time, compared to the existing technology, the present disclosure also has following remarkable advantages as follow.

Flexible electronic device requires voltage to respond rapidly during operation, while the step-down mode which the existing technology uses usually needs seconds or even tens of seconds to discharge. It cannot satisfy the working requirement. The mechanical switch module employs the mode of a wafer's near field electric arc short circuit. It can be discharged rapidly within milliseconds and can achieve relatively low stable voltage by single-chip's voltage regulating.

The mechanical switch module employs automatic control mode, utilizes control circuit to automatically control steering engine's rotating angle after receiving the step-down signal. So that it can control the location of contact point, automatically return to its original location within the permitting safety time and achieve the goal of rapidly discharging. So this technology won't restrict the free moving function of flexible devices.

If the duration of short circuit discharging produced by the mechanical switch module exceeding a certain range will cause damage to the circuit; so the two contact points' time of being kept at certain distance should be controlled by inputting steering engine's angular timed rotating program so as to protect circuit's damage caused by exceeding short circuit.

In the process of practical use, the output voltage is relatively high and can reach 6000 V or so. The electric arc caused by air breakdown is more than 8 mm under indoor conditions. So the electronic switch and the small-sized mechanical relay cannot sustain it. High-voltage relay doesn't satisfy the design requirements of small-sized power source due to its large volume. While the mechanical switch achieves the function of short circuit's voltage regulating after satisfying small-sized requirements.

BRIEF DESCRIPTION OF THE DRAWINGS

FIG. 7 (b) is a diagram illustrating a ten-time voltage rectifying circuit of the present disclosure.

As shown in FIGS. Above, 11 indicates a flexible frame; 21 indicates driving membranes; 31 and 32 indicates interior compliant electrodes; 4 indicates external compliant electrodes; 51 and 52 indicate interior wires, respectively; 6 indicates a protecting membrane; and 7 indicates an unidirectional frictional mechanism.

DETAILED DESCRIPTION OF THE PREFERRED EMBODIMENTS

The following implementation is only used to illustrate the present disclosure while isn't used to restrict the range of the present disclosure. Besides it should be understood that after reading the content which the present disclosure has proposed, this field's technicians can make various changes or modifications to the present disclosure. These equivalent forms are also included in the range that the present application's attached claims have restricted.

Implementation 1

Figure 1:
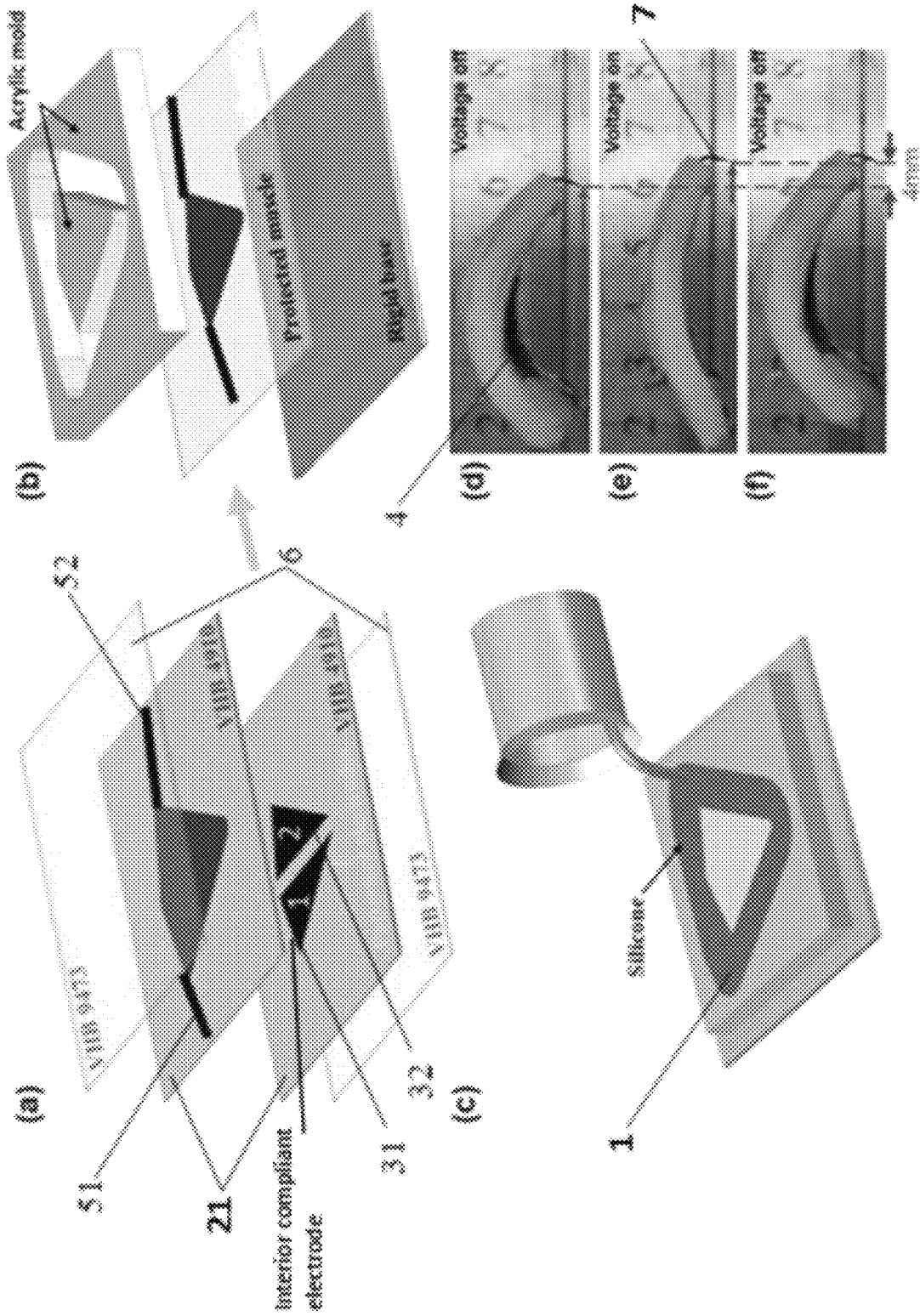
FIG. 1 is a general manufacturing flow chart of a flexible and soft smart driving device.
Figure 2:
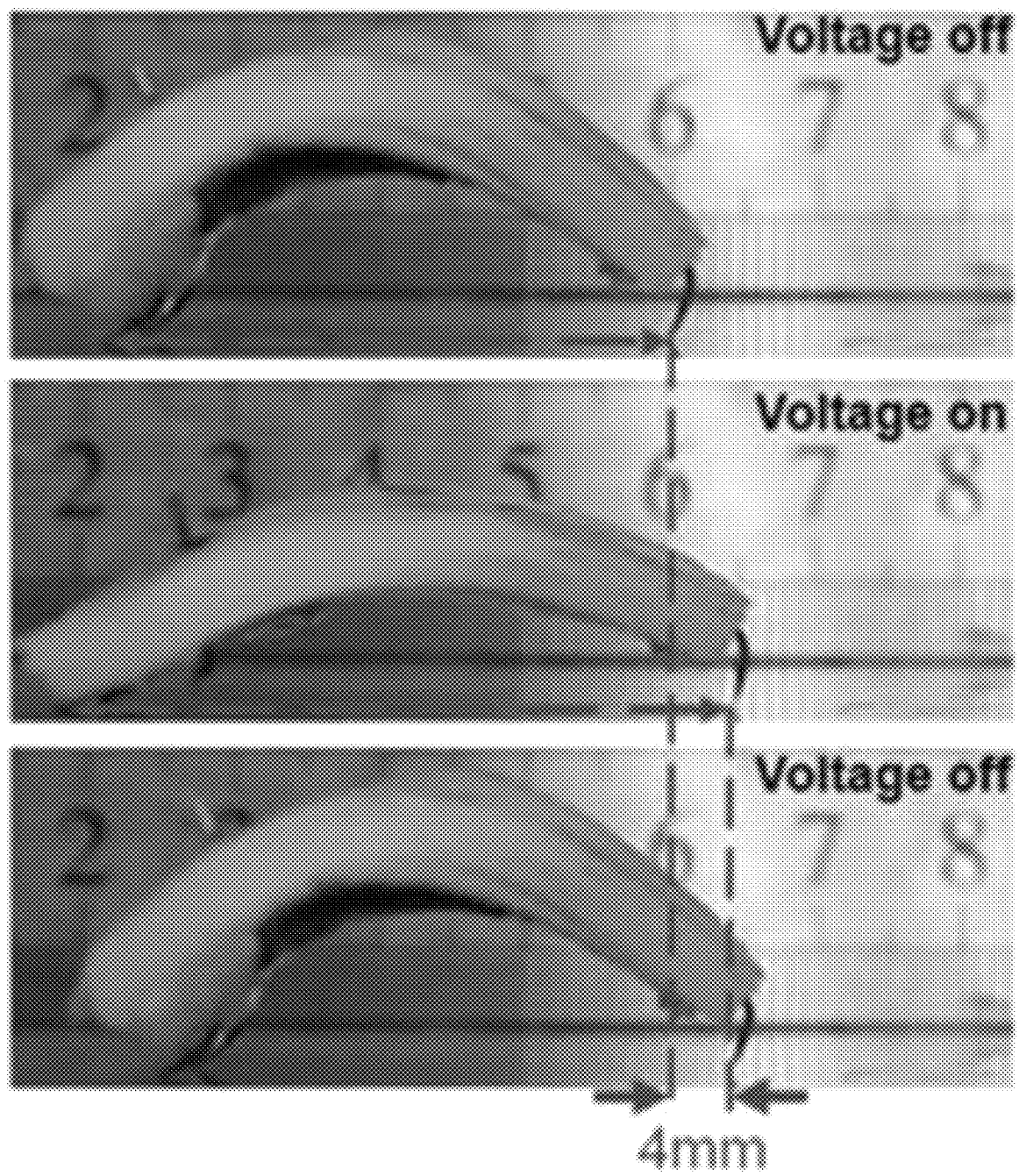
FIG. 2 is a creeping sketch map of a flexible and soft smart driving device.
Figure 3:
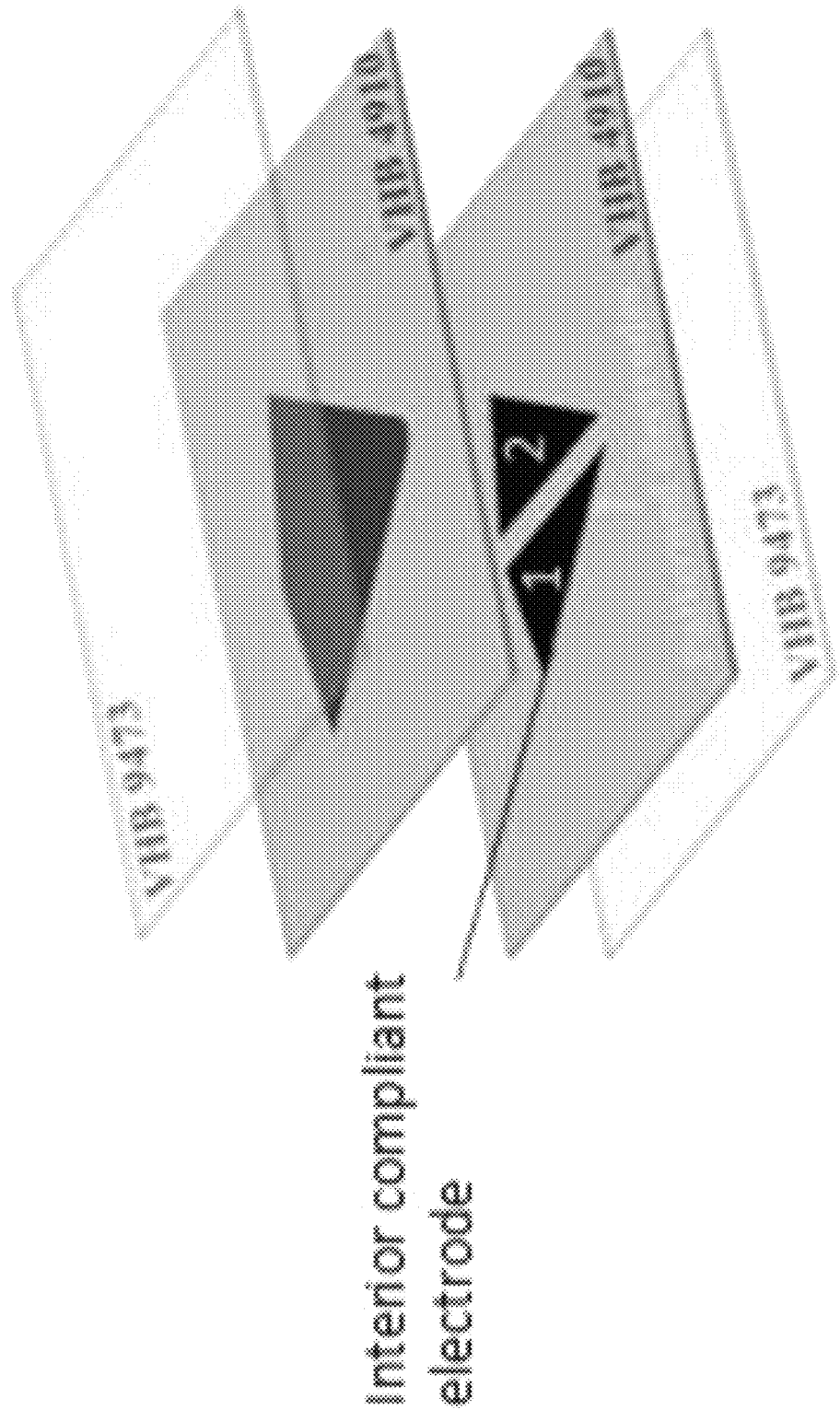
FIG. 3 is a membrane's constitutional diagram illustrating a flexible and soft smart driving device.
Figure 4:
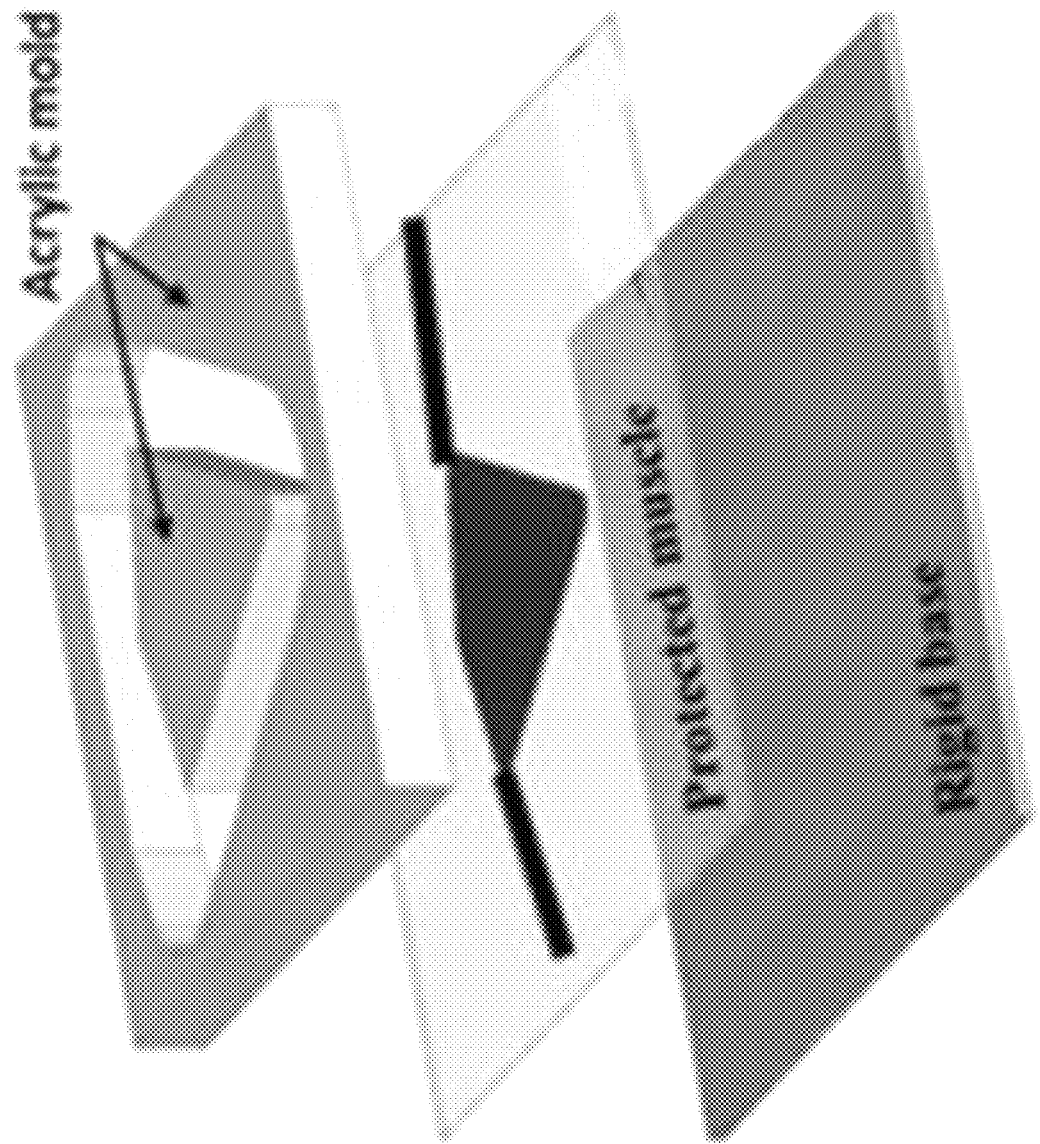
FIG. 4 is a diagram of a manufacturing mound for the flexible and soft smart driving device.
Figure 5:
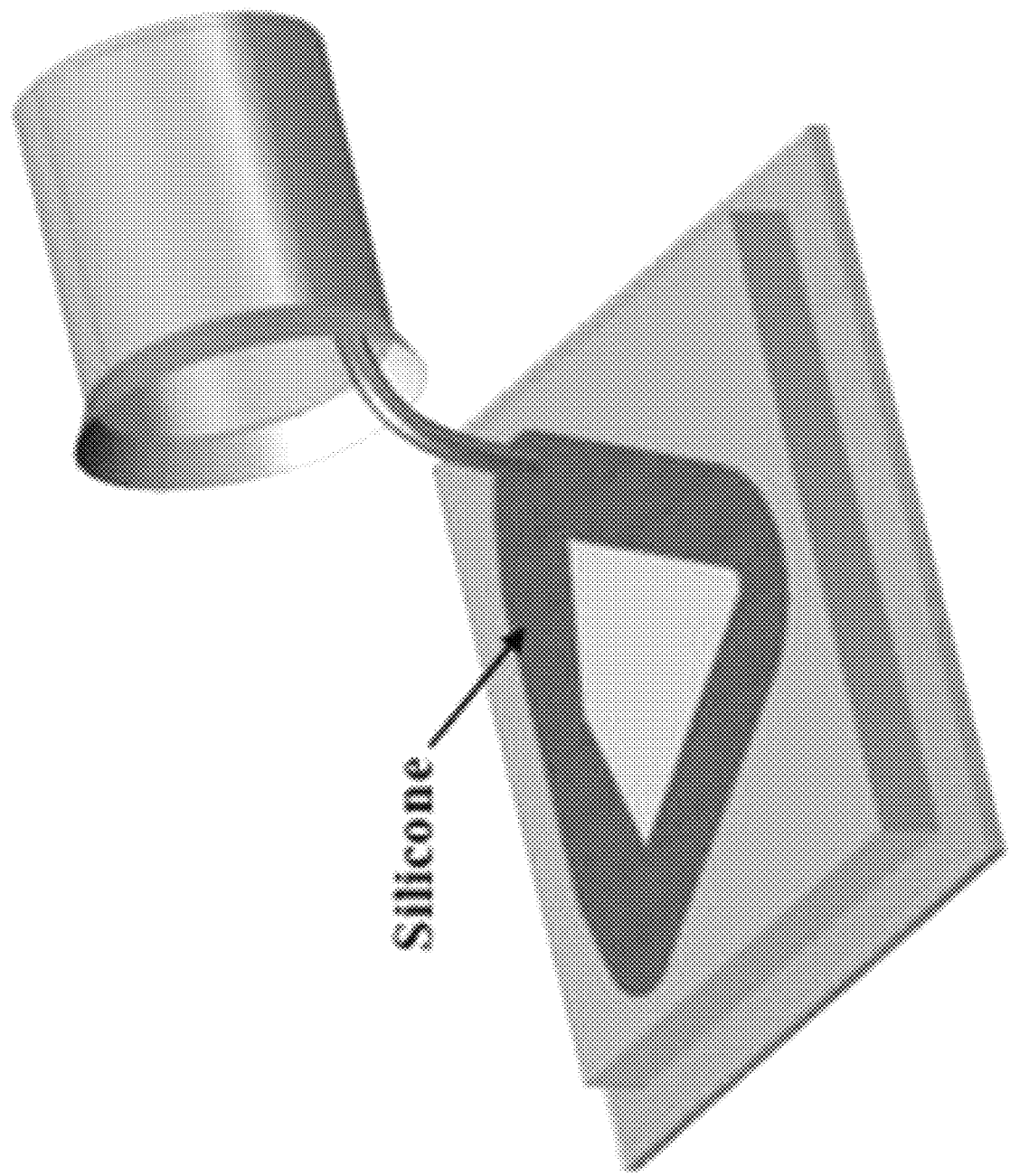
FIG. 5 is a frame shaping diagram illustrating a flexible and soft smart driving device.

As shown in FIG. 1, the present disclosure offers a kind of flexible and soft smart driving device, it is composed of flexible frame 11, driving structure, protecting structure and creeping structure. The driving structure may include driving membrane array, interior compliant electrodes 31 and 32, external compliant electrodes 4 and interior wires 51 and 52. The protecting structure is protecting membranes 6, the creeping structure is unidirectional frictional mechanism 7, the flexible frame 11 offers attaching substrate for driving structure, creeping structure and protecting structure. The driving structure is able to produce driving force. The protecting structure is able to prevent electric leakage. The creeping structure is able to improve creeping ability of the flexible and soft smart driving device.

The driving membrane array is composed of two pieces of driving membranes 21. Its material is VHB 4910 (3M, this material is a kind of transparent membrane). The interior compliant electrodes 31 and 32 are sandwiched between two pieces of driving membranes and are packaged in the inner part of the driving membranes 21.

One end of the interior wires 51 and 52 is extended into the middle of two pieces of driving membranes 21, and is contacted with interior compliant electrodes 31 and 32 respectively (interior wire 51 is contacted with interior compliant electrode 31, interior wire 52 is contacted with interior compliant electrode 32). The other end of the interior wires is led out to connect to the live wire of the external power source. The material of the interior wires is tinfoil.

The protecting membrane 6 is divided into two pieces, two pieces of protecting membrane 6 are attached to both sides of the driving membranes 21 respectively. The material of the protecting membrane is VHB9473 (3M, this material is a kind of transparent membrane).

The flexible frame 11 offers attaching substrate for driving structure, creeping structure and protecting structure. Its material is translucent silicone. After combining driving membranes, protecting membrane, interior wires and interior compliant electrodes in order as a combined membrane, the combined membrane is bonded to the flexible frame 11 as a whole.

The external compliant electrodes 4 is directly coated on both sides of the combined membrane which has been bonded to the flexible frame 11. The materials of the interior compliant electrodes and the external compliant electrodes both are carbon greases.

The unidirectional frictional mechanism 7 is three stainless steel's hooks. Each stainless steel's hook only has one hook. One end of the stainless steel's hook is inserted into the inner part of the flexible and soft smart driving device's flexible frame 11. The other end is contacted with ground.

The present disclosure the flexible and soft smart driving device can also employ polydimethylsiloxane (PDMS) as flexible frame, and employ conducting gels as compliant electrodes at the same time. Because PDMS and conducting gels are both transparent materials, and driving membranes and protecting membrane is also transparent material, the whole flexible and soft smart driving device can be hyalinized.

Specifically, the present disclosure the flexible and soft smart driving device should be manufactured as the following order: driving structure, protecting structure, flexible frame, creeping structure. In the present implementation, it should be manufactured as the order of (a), (b), (c), (d) in FIG. 1.

Compared to other structures, the present disclosure the flexible and soft smart driving device's driving structure is relatively complex. As shown in FIG. 1 (a), two pieces of driving membranes 21 should undergo same pre-stretch when manufactured, and should undergo pre-stretch in both creeping direction and the direction perpendicular to the creeping direction. And the pre-stretch in creeping direction is slightly larger than the pre-stretch in the direction perpendicular to the creeping direction. After the first driving membranes 21 is pre-stretched, it is fixed to a fixed frame. The interior compliant electrodes 31 and 32 with certain shape are coated on the driving membranes 21 and the interior wires 51 and 52 are arranged. Another piece of pre-stretched driving membranes 21 is attached to the first driving membranes 21, and that's making interior compliant electrodes 31 and 32 and interior wires 51 and 52 are sandwiched between two pieces of driving membranes 21. Wherein the interior ends of interior wires 51 and 52 are contacted with two pieces of interior compliant electrodes 31 and 32 respectively. The external ends are led out to connect with the live wire of external power source.

The protecting structure of the present disclosure the flexible and soft smart driving device is relatively simple. As shown in FIG. 1 (a), after two pieces of protecting membranes 6 undergo the same pre-stretch as two pieces of driving membranes 21 do, the two pieces of protecting membranes 6 are attached to both sides of the two pieces of driving membranes 21 respectively and constitute the combined membrane with the driving membranes. As shown in FIG. 1 (b), the combined membrane is still fixed at the fixed frame at this time.

After the combined membrane is completed, the pre-designed molds are put on the combined membrane in the order of FIG. 1 (b). The silicone which contains curing agent is injected into molds, as is shown in FIG. 1 (c). And then the mold is put into thermotank. After silicone is cured, the flexible frame 11 has been shaped, and the combined membrane is bonded firmly with flexible frame at the same time. And then the external compliant electrodes 4 is directly coated on the naked parts of the both sides of the protecting membrane 6.

The creeping structure of the present disclosure the flexible and soft smart driving device is unidirectional frictional mechanism 7. Three stainless steel's hooks are chosen as unidirectional frictional mechanism. After the flexible frame 11 has been shaped, one end of the stainless steel's hook is inserted into flexible frame 11 by a certain arranging mode (the front end of the flexible frame is arranged one, and the rear end is arranged two). The other end is extended to contact with ground and functions as the flexible and soft smart driving device's moving foot or creeping foot. At this time, the entire flexible and soft smart driving device is completely manufactured, as is shown in FIG. 1 (d).

The present disclosure the flexible and soft smart driving device's size is namely the flexible frame's size. It can choose different sizes' flexible frames to manufacture different sizes' flexible and soft smart driving devices according to different requirements.

The driving force producing principle of the present disclosure the flexible and soft smart driving device is as follows: high-voltage source applies totally opposite charge on interior compliant electrodes and external compliant electrodes, namely interior compliant electrodes are applied positive charges and external compliant electrodes is applied negative charges. So in this three-layer electrodes (one layer in interior, two layers in external), every adjacent two layers both produce attracting force. The attracting force produces a compressing effect along the normal direction of the membrane plane on the two-layer driving membranes. The compressing effect makes the pre-stretched driving membrane's thickness become thinner and area become larger. The whole effect is making the driving membranes relax. At the same time, the positive charges in interior compliant electrodes repulse each other. And this makes each part of the interior compliant electrodes produce repulsive force. Similarly, each part of the external compliant electrodes also produces repulsive force. Because interior compliant electrodes and external compliant electrodes is directly coated on the driving membranes, its effect is also making the driving membranes relax. While because the driving membranes is pre-stretched, it possesses resilience. And when the driving membranes is fixed on the flexible frame, it makes the flexible frame buckle to a certain degree before applying voltage. After applying voltage, the driving membrane's relaxation effect can lower flexible frame's buckling degree and even make it return to straight state, namely the flexible and soft smart driving device relaxes. If removing voltage at this moment, the flexible frame returns to the original buckling state again, namely the flexible and soft smart driving device contracts. So when applying periodic voltage such as square-wave voltage to the compliant electrode, the flexible and soft smart driving device will continuously contract and relax, thus achieving worm-like creeping movement.

Since the present disclosure the flexible and soft smart driving device's driving principle is utilizing dielectric elastomer's intrinsic strain to produce driving force, high-voltage source is needed as input source. When the interior wires 51 and 52 are connected to the live wire of the high-voltage source and the external compliant electrodes 4 is connected to the ground wire of the high-voltage source, the interior compliant electrodes 31 and 31 are applied positive voltage and the external compliant electrodes is applied negative voltage. At this time, by inputting waveform's adjustment can achieve the flexible and soft smart driving device's creeping.

Implementation 2

In the present implementation, employing implementation 1's method, employing 30 mm*30 mm*4 mm (length*width*thickness)'s flexible frame to manufacture the size of 30 mm*30 mm*4 mm's flexible and soft smart driving device. Its weight is only 5 g by measurement. Since its light weight, the flexible and soft smart driving device produces very low noise during creeping. The noise is only 10 db or so by measurement.

By changing the amplitude and frequency of the externally applied voltage in this implementation, can change the flexible and soft smart driving device's creeping speed. According to the experimental results of the flexible and soft smart driving device in the present implementation, the creeping speed can be maximized at 95 mm/s under 9 kV, 16 Hz of the square-wave signal input. This creeping speed is far higher than existing robots' creeping speeds. At the same time, the flexible and soft smart driving device is able to change direction agilely by applying partition control to the interior electrodes.

Besides, the flexible and soft smart driving device in the present implementation is carried out the experiment of resisting external pressure. The flexible and soft smart driving device is applied 1.55 kN's force by indenter and is pressed flat. It is able to restore to original configuration and continue to creep within one second, and sustain the original creeping speed.

Figure 6:
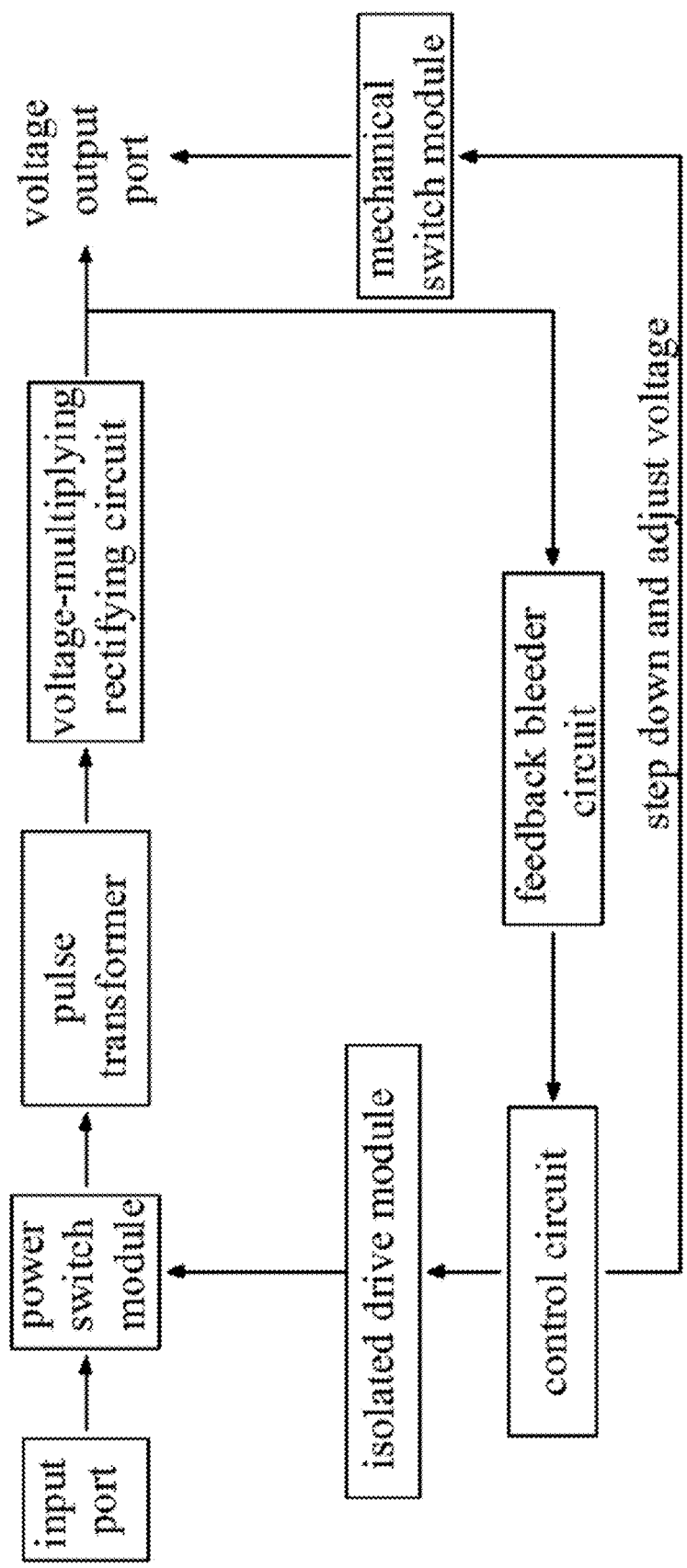
FIG. 6 is a structure diagram of the present disclosure.

As is shown in FIG. 6, the present disclosure additionally provides a kind of rapidly dischargeable and continuously tunable small-sized high-voltage source module, wherein:

The rapidly dischargeable and continuously tunable small-sized high-voltage source module may include input port, power switch module, pulse transformer, voltage-multiplying rectifying circuit, voltage output port, feedback bleeder circuit, control circuit, isolated drive module, mechanical switch module;

The input port, which is connected to power switch module is used to supply input voltage to power switch module;

The power switch module, is connected to the isolated drive module and the pulse transformer respectively, and is controlled by switch driving signals from isolated drive module. Power switch module converts input voltage from input port to high frequency switch signal which outputs to pulse transformer.

The pulse transformer, which is connected to the power switch module and the voltage-multiplying rectifying circuit, is used to independently amplify high frequency switch signal from power switch module, and output to voltage-multiplying rectifying circuit.

The voltage-multiplying rectifying circuit, which is connected to the pulse transformer and the voltage output port, is used to step up the signal from pulse transformer, and step up to the voltage needed and then rectify the signal to output to voltage output port.

The voltage output port, which is connected to the voltage-multiplying rectifying circuit, the mechanical switch module and the feedback bleeder circuit respectively, is used to output ultimate voltage signal.

The feedback bleeder circuit, which is connected to the voltage output port and the control circuit respectively, is used to feed back the voltage signal from the voltage output port to the control circuit, and then to achieve the constant voltage modulation of the high-voltage source module's output voltage.

The control circuit, which is connected to the isolated drive module, the feedback bleeder circuit and the mechanical switch module respectively, produces the switch control signal and the step-down control signal according to the signal from the feedback bleeder circuit, outputs the switch control signal to the isolated drive module and outputs the step-down control signal to the mechanical switch module. The control circuit achieves the constant voltage modulation of the high-voltage source module's output voltage.

The isolated drive module, which is connected to the control circuit and the power switch module respectively, is used to amplify the power of the switch control signal from the control circuit and convert to switch driving signal and then output it to the power switch module. The isolated drive module achieves the electric isolation between the control circuit and the power switch module.

The mechanical switch module, which is connected to the voltage output port and the control circuit respectively, accepts the step-down control signal from the control circuit, and discharges redundant charge in the voltage output port to achieve the step-down of the output voltage.

Specifically, the control circuit is STC89C51 chip; the isolated drive module may include a cache driver chip and an optical coupler; the cache driver chip is 74HC244; the optical coupler is TLP521-1. The voltage-multiplying rectifying circuit is ten-time voltage rectifying circuit. The control circuit is single-chip control circuit, and is connected to the mechanical switch module. The control circuit is used to control the mechanical switch to conduct near field electric arc short circuit in its step-down and adjusting voltage process to discharge redundant charges.

The specific adjusting voltage process is: original voltage provided by input port is inputted to the power switch module, and is used to provide voltage for the power switch module. After the control circuit's control signal is current-amplified through cache driver chip and electric-isolated through optical coupler, the control signal is inputted to the power switch module to control power switch module to output rectangular impulse voltage with corresponding duty circle. The outputting impulse voltage is voltage-amplified 50 times through the pulse transformer to achieve the impulse voltage output of 0~600V, and is able to achieve direct voltage output of 0~6000V by the voltage-multiplying rectifying circuit. The voltage output port is fed to the control circuit through a feedback bleeder circuit with a 10 megohm resistor and a 15 ohm resistor to achieve precisely voltage adjusting.

Figure 7A:
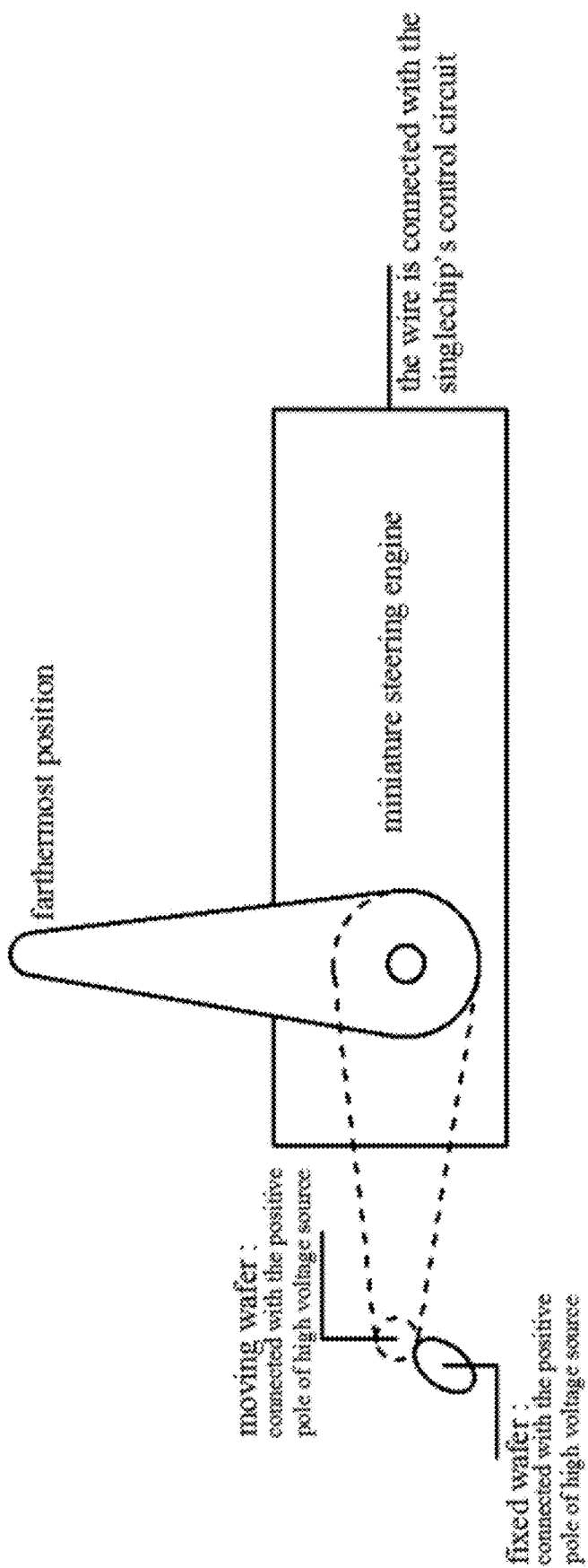
FIG. 7 (a) is a block diagram illustrating a mechanical switch module of the present disclosure.
Figure 7B:
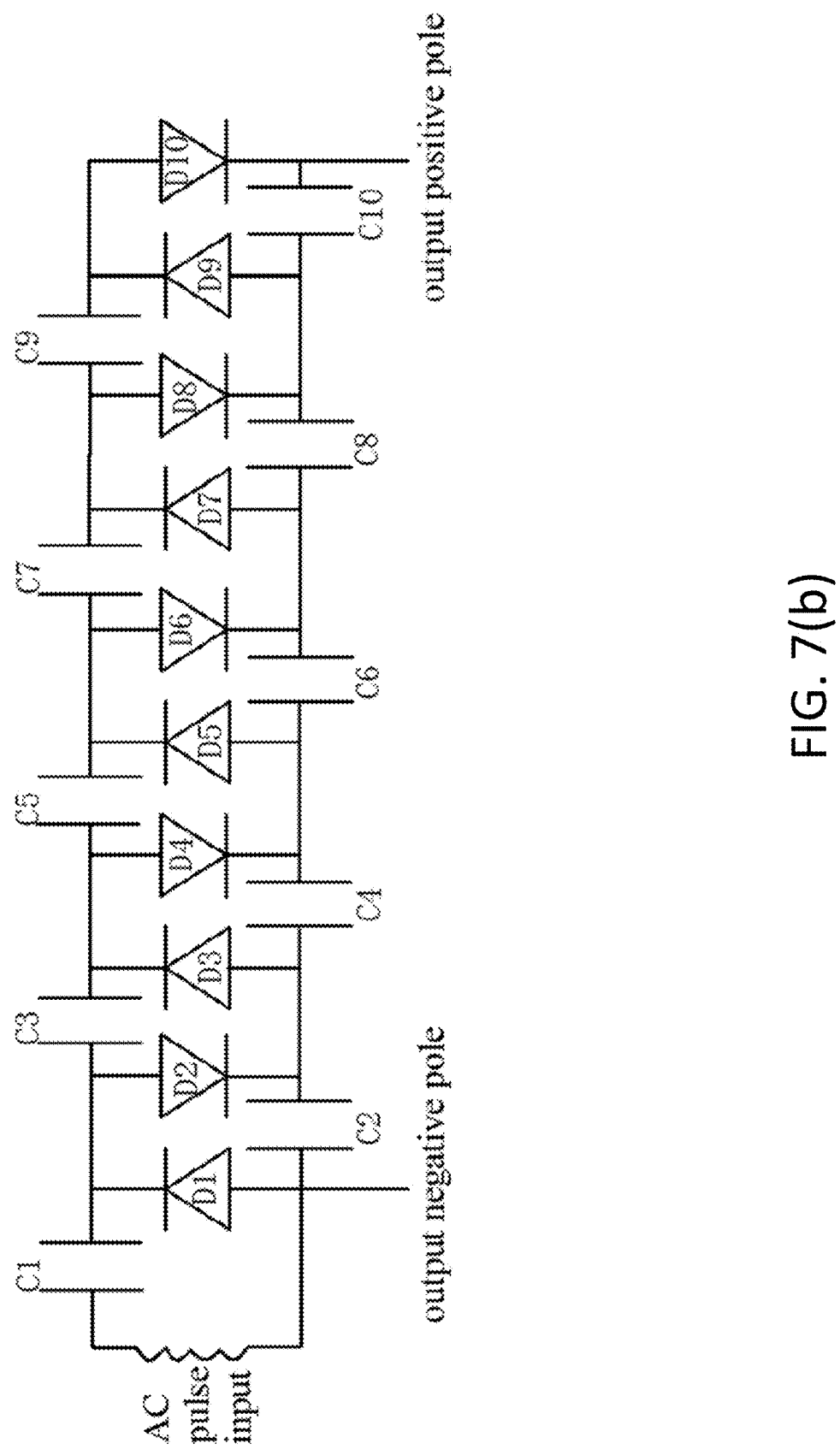

As is shown in FIG. 7 (a), the specific operating manner of the mechanical switch module is: in the process of stepping up voltage, mechanical switch module's position keeps unchanged; in the process of stepping down and adjusting voltage, controls signal is inputted to make single-chip's program operate, miniature steering engine's rotation angle is adjusted, the moving wafer is controlled by miniature steering engine to conduct near field electric arc short circuit with fixed wafer to discharge redundant charges in the capacitance. At the same time, after the charges have been discharged completely, single-chip's control circuit controls steering engine to rotate reversely at once and restore to original position rapidly to achieve voltage-stepping down and safety-protecting.

As is shown in FIG. 7 (b) is a ten-time voltage rectifying circuit. Ten times voltage rectifying circuit is five twice voltage rectifying circuits combined in series. Here is a brief working principle's description of the voltage-multiplying rectifying circuit by the example of twice voltage rectifying circuit.

Figure 8:
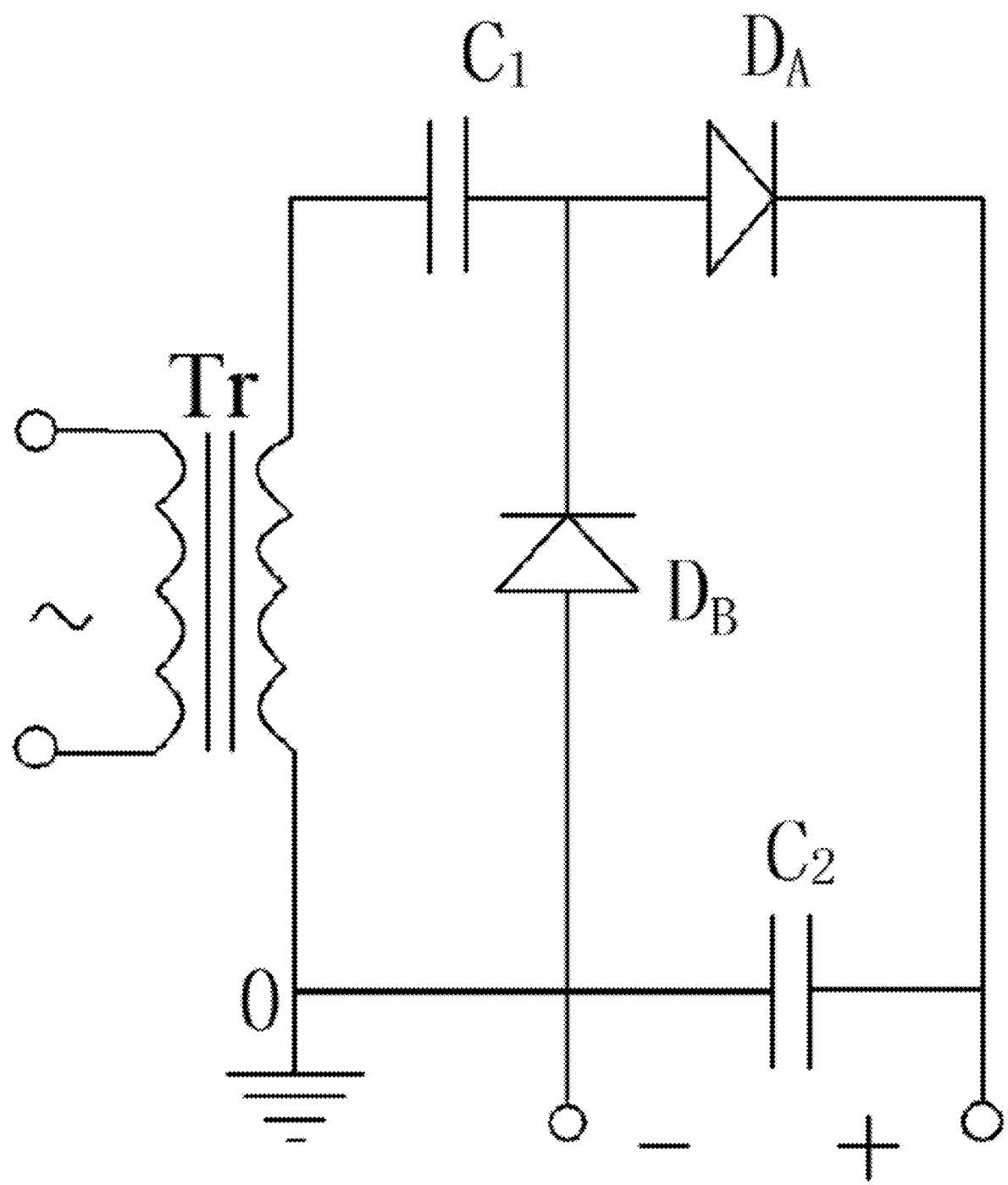
FIG. 8 is a diagram illustrating a voltage-multiplying rectifying circuit of the present disclosure.

As is shown in FIG. 8 is the schematic of a twice voltage rectifying circuit. At the two ends of the transformer is high frequency alternating current, of which the peak voltage is $E_2$. When two ends' voltage is in negative half circle (transformer's top end is negative voltage, bottom end is positive voltage), diode $D_B$ is in conducting state and diode $D_A$ is in blocking state, current charges capacitance $C_1$ through $D_B$ to make $C_1$'s voltage approximate peak voltage $E_2$ and remain almost unchanged. At this time, the left end of capacitance $C_1$ is negative, the right end is positive. When two ends' voltage is in positive half circle (transformer's top end is positive voltage, bottom end is negative voltage), diode $D_A$ is in conducting state and diode $D_B$ is in blocking state. At this time, capacitance $C_2$'s voltage is the sum of capacitance $C_1$'s voltage and power source's voltage $E_2$ in series, current charges capacitance $C_2$ through $D_A$, the charging voltage $U_2$ equals to $2E_2$. It's difficult to charge fully within one circle. After several circles' repeatedly charging, $C_2$'s direct voltage is almost stabilized at $2E_2$, which achieves alternating current's effects of twice voltage amplifying and rectifying. Five twice voltage rectifying circuits' combination in series is able to achieve ten-time voltage amplifying and rectifying.

It is should be understood that these implementations are only used to illustrate the present disclosure, but are not used to restrict the present disclosure's boundary. Any revisions or equivalent replacements within the boundary of the spirit and principle of the present disclosure, should be included in the protecting boundary of the present disclosure.

What is claimed is:
1. A flexible and soft smart driving device comprising:
a flexible frame, a driving mechanism and a movement structure, such as creeping structure;
a power source module associated with the driving mechanism, and wherein:
the driving mechanism uses the intrinsic strain of intelligent soft material to generate the driving force;
the movement structure implementing autonomous activities of the flexible and soft smart driving device;
the driving mechanism and the movement structure are attached to the flexible frame;
the flexible and soft smart driving device utilizes the friction between the flexible frame's self-deformation and the contact surface to creep;
the power source module is small-sized high-voltage source module which is rapidly dischargeable and continuously tunable, the power source module comprises input port, power switch module, pulse transformer, voltage-multiplying rectifying circuit, voltage output port, feedback bleeder circuit, control circuit, isolated drive module, mechanical switch module;
the input port, which is connected to power switch module, is used to supply input voltage to the power switch module;

the power switch module, which is connected to the isolated drive module and the pulse transformer respectively, is controlled by switch driving signals from the isolated drive module;

the power switch module converts input voltage from input port to high frequency switch signal which outputs to the pulse transformer;

the pulse transformer, which is connected to the power switch module and the voltage-multiplying rectifying circuit respectively, is used to independently amplify high frequency switch signal from the power switch module and output to voltage-multiplying rectifying circuit;

the voltage-multiplying rectifying circuit, which is connected to the pulse transformer and the voltage output port respectively, is used to voltage-multiply the signal from the pulse transformer, and step up to the voltage needed and then rectify the signal to output to the voltage output port;

the voltage output port, which is connected to the voltage-multiplying rectifying circuit, the mechanical switch module and the feedback bleeder circuit respectively, is used to output ultimate voltage signal;

the feedback bleeder circuit, which is connected to the voltage output port and the control circuit respectively, is used to feed back the voltage signal from the voltage output port to the control circuit, and then to achieve the constant voltage modulation of the high-voltage source module's output voltage;

the control circuit, which is connected to the isolated drive module, the feedback bleeder circuit and the mechanical switch module respectively, produces the switch control signal and the step-down control signal according to the signal from the feedback bleeder circuit, outputs the switch control signal to the isolated drive module and outputs the step-down control signal to the mechanical switch module;

the control circuit achieves the constant voltage modulation of the high-voltage source module's output voltage;

the isolated drive module, which is connected to the control circuit and the power switch module respectively, is used to amplify the power of the switch control signal from the control circuit and convert to switch driving signal and then output it to the power switch module;

the isolated drive module achieves the electric isolation between the control circuit and the power switch module;

the mechanical switch module, which is connected to the voltage output port and the control circuit respectively, accepts the step-down control signal from the control circuit, and discharges redundant charge in the voltage output port to achieve the step-down of the output voltage.

2. The flexible and soft smart driving device of claim 1, wherein the mechanical switch module comprises two wafers and one miniature steering engine; the two wafers comprise a moving wafer and a fixed wafer, the moving wafer is connected to the positive pole of the voltage output port, the fixed wafer is connected to the negative pole of the voltage output port; the moving wafer is connected to the miniature steering engine, and the miniature steering engine is connected to the moving wafer and the control circuit respectively.

3. The flexible and soft smart driving device of claim 1, wherein the isolated drive module comprises a cache driver chip and an optical coupler; the cache driver chip is connected to the control circuit and the optical coupler respectively; the optical coupler is connected to the cache driver chip and the power switch module respectively.

4. The flexible and soft smart driving device of claim 1, wherein the range of the input port's voltage is 5 V-32 V direct current.

5. The flexible and soft smart driving device of claim 1, wherein the discharging time of the output fast stepping down voltage is below 700 milliseconds.

6. The flexible and soft smart driving device of claim 1, wherein the control circuit is single chip control circuit.

7. The flexible and soft smart driving device of claim 1, wherein the output voltage of the high-voltage source module is 0V-6000 V direct current and is continuously tunable.

8. The flexible and soft smart driving device of claim 7, wherein the pulse transformer outputs high frequency switch signal with 0V-600 V.

9. The flexible and soft smart driving device of claim 8, wherein the voltage-multiplying rectifying circuit is ten times voltage rectifying circuit.

10. The flexible and soft smart driving device of claim 1, wherein the output voltage of the high-voltage source module is 2000 V-15000 V direct current and is continuously tunable.

* * * * *